United States Patent [19]

Higgins, III

[11] Patent Number: 5,639,989

[45] Date of Patent: Jun. 17, 1997

[54] SHIELDED ELECTRONIC COMPONENT ASSEMBLY AND METHOD FOR MAKING THE SAME

[75] Inventor: Leo M. Higgins, III, Austin, Tex.

[73] Assignee: Motorola Inc., Schaumburg, Ill.

[21] Appl. No.: 229,495

[22] Filed: Apr. 19, 1994

[51] Int. Cl.$^6$ ........................................... H05K 1/00
[52] U.S. Cl. ................... 174/35 MS; 174/35 R; 361/816; 361/818; 257/655; 257/660
[58] Field of Search .................. 174/35 R, 260, 174/35 MS; 361/816, 818; 257/655, 660, 728, 659

[56] References Cited

U.S. PATENT DOCUMENTS

| | | | |
|---|---|---|---|
| 5,146,047 | 9/1992 | Nagata et al. | 174/35 MS |
| 5,166,772 | 11/1992 | Soldner et al. | 257/659 |
| 5,166,864 | 11/1992 | Chitwood et al. | 361/386 |
| 5,175,613 | 12/1992 | Barker, III et al. | 257/713 |
| 5,341,274 | 8/1994 | Nakatani et al. | 361/818 |
| 5,379,185 | 1/1995 | Griffen et al. | 361/709 |
| 5,392,197 | 2/1995 | Cuntz et al. | 361/818 |
| 5,394,304 | 2/1995 | Jones | 361/765 |
| 5,513,078 | 4/1996 | Komrska et al. | 361/816 |

FOREIGN PATENT DOCUMENTS 2055413  5/1992  Canada ............... H05K 1/16

OTHER PUBLICATIONS

William M. Hall; "Design Tech. for Control of Radiated and Conducted Noise in Portable Computing Equipment;" Northcon Conference, Oct. 1–3, '91; pp. 258–263 (Oct. 1991).

Howard W. Markstein; "Shielding Electronics From EMI/RFI;" Electronic Packaging & Production; pp. 40–44 (Jan. 1991).

*Primary Examiner*—Laura Thomas
*Attorney, Agent, or Firm*—Patricia S. Goddard

[57] ABSTRACT

Electronic components are shielded from electromagnetic interference (EMI) by one or more conformal layers filled with selected filler particulars for attenuate specific EMI frequencies or a general range of frequencies. Shielding is accomplished through the use of a single general purpose shielding layer, or through a series of shielding layers for protecting more specific EMI frequencies. In a multilayer embodiment, a semiconductor device (50) is mounted on a printed circuit board substrate (16) as a portion of an electronic component assembly (10). A conformal insulating coating (24) is applied over the device to provide electrical insulation of signal paths (e.g. leads 54 and conductive traces 18) from subsequently deposited conductive shielding layers. One or more shielding layers (60, 62, and 64) are deposited, and are in electrical contact with a ground ring (56). In a preferred embodiment, the ground connections for the shield layers are separate from those used for power distribution within the devices.

27 Claims, 7 Drawing Sheets

SHIELDED ELECTRONIC COMPONENT ASSEMBLY AND METHOD FOR MAKING THE SAME

FIELD OF THE INVENTION

The present invention relates to electronic component assemblies in general, and more specifically to electronic component assemblies which are shielded to protect against electromagnetic interference (EMI).

BACKGROUND OF THE INVENTION

Electromagnetic interference (EMI) is the generation of undesired electrical signals, or noise, in electronic system circuitry due to the unintentional coupling of impinging electromagnetic field energy. Any propagating electrical signal is comprised of an electric field (E-) and magnetic field (H-) component. The sinusoidal nature of the signal results in the tendency of circuit components, such as wires, printed circuit board conductors, connector elements, connector pins, cables, and the like, to radiate a portion of the spectral energy comprising the propagating signal. Circuit elements are effective in radiating spectral components which have wavelengths similar to the radiating element dimensions. Long circuit elements will be more effective in radiating low frequency noise, and short circuit elements will be more effective in radiating high frequency noise. These circuit elements behave just like antennae which are designed for the transmission of the radiating wavelengths.

Integrated circuits (ICs) which have output drivers that create pulses with high amounts of spectral energy are more likely than low power drivers to cause EMI due to the probable mismatch between the driver and line impedance, and the resistance to instantaneous signal propagation imposed by the parasitics of the conductor. For instance, CMOS (complementary metal oxide semiconductor) ICs which switch 5 volts in rapid rise times can have a large content of high frequency components and high spectral energy during operation. If the rise time of a propagating signal is less than the round trip propagation delay from source to load, then the conducting medium will behave as a transmission line. In such a connection, variations in the characteristic impedance [$Z_o$, where: $Z_o \sim (L/C)^{1/2}$; L=conductor inductance; C=conductor capacitance] along the line will cause perturbations in the electromagnetic field associated with the propagating signal. These disturbances in the electromagnetic field result in reflections of portions of the signal energy at the points where the variation occurred. If the signal is not totally absorbed by the load at the end of the conductor length, due to unmatched impedances or lack of proper line termination, the unabsorbed energy will be reflected back towards the source. These reflections give rise to radiated emissions. Proper termination and controlled impedance interconnections will reduce radiated noise significantly.

The coupling of signal energy from an active signal net onto another signal net is referred to as crosstalk. Crosstalk is within-system EMI, as opposed to EMI from a distant source. Crosstalk is proportional to the length of the net parallelism and the characteristic impedance level, and inversely proportional to the spacing between signal nets. Proper interconnect layout design can reduce the incidence of crosstalk. Strong sources of low impedance, H-field rich EMI are relatively high current and relatively low voltage components such as power supply, solenoids, transformers, and motors. If the H-field possesses high intensity, the field can induce spurious current flow in other system components. Thus, noise radiated from within a system can interfere with system performance by coupling with other system elements, not just adjacent conductor nets, as another form of within-system EMI.

Electronic systems are becoming smaller, and the density of electrical components in these systems is increasing. As a result, the dimensions of the average circuit element is decreasing, favoring the radiation of higher and higher frequency signals. At the same time, the operating frequency of these electrical systems is increasing, further favoring the incidence of high frequency EMI. EMI can come from electrical systems distant from a sensitive receiving circuit, or the source of the noise can come from a circuit within the same system (crosstalk or near source radiated emission coupling). The additive effect of all these sources of noise is to degrade the performance, or to induce errors in sensitive systems. The prevalence of high frequency systems and portable electronics is creating a very complex spectral environment for the operation of sensitive electrical systems. The Federal Communications Commission (FCC) and the Federal Aviation Association (FAA) regulations on radiated emissions are becoming increasingly difficult to meet without adding to system size, mass, or cost due to the need for the EMI shielding.

EMI shielding has taken many forms. Sensitive or radiating devices are often covered with a lid or enclosure which is connected to ground potential in the process of securing the cover in place. Shielding close to the source, where the field intensity is the highest, requires greater shield efficiency to contain the field. Therefore, in many cases it has been more common to shield the sensitive, EMI receiving component. In some instances, entire circuit boards are covered with a grounded lid. Polymer thick film conductor materials, such as a screen-printable copper filled epoxy paste, are sometimes used to form a shield. In other known EMI shielding methods, individual ferrite components are often placed on device pins or in series with a circuit to attenuate unwanted noise which may be causing system errors, or acting as sources of radiated emissions. In another application of ferrite beads or elements, a ferrite component is used with a capacitor in order to form a low frequency inductance-capacitance (LC) band pass filter, effectively shorting unwanted signal frequency components to ground.

Many enclosed systems powered by external alternating current wiring are also shielded from EMI by the incorporation of internal shields. As one example, a metal cabinet housing which encloses the system may be designed to function as a shield. However, metal housings are often too expensive or heavy for portable applications. To avoid some of the weight and expense, the inside of a molded plastic housing may be coated with a thin metal film. Sometimes metal-filled paints are applied to the housing. If cost permits, metal-filled plastic is sometimes used to form the housing. In most cases these different types of shields are connected to ground potential. Any break in the shield will form an aperture through which radiation will emit. Thus, great care is taken to use conductive gaskets to seal access areas. Also within housings, a conductive metal screening may be inserted in the air flow path of a fan-powered cooling system to help reduce radiated emissions from the cooling or exhaust port.

A common feature of these and other prior art EMI shielding methods is that the prior art methods are attempt to shield EMI in a broad sense using an "all-encompassing" shield material. However, such broad approaches are not sufficiently effective. As an example, a metal housing may shield the enclosed electronic devices from various E-field components of EMI, but not H-field components. Accordingly, an alternative shielding method which more specifically targets shielding of particular EMI frequency ranges would be welcome. Particularly, such a method should effectively prevent radiative emissions and protect system components from a selected spectrum of impinging electromagnetic radiation without significant additions to system size, mass, or cost. Fulfilling this need is a growing concern as portable electronics and communications become increasingly popular.

SUMMARY OF THE INVENTION

In one form of the invention, an electronic component assembly is shielded. The assembly has a wiring substrate having a plurality of conductive signal traces and at least one ground element formed on a surface thereof. The assembly also has a semiconductor device mounted to the wiring substrate and electrically coupled to the plurality of signal traces. A conformal insulating layer is formed over the semiconductor device and over the signal traces, such that a portion of the at least one ground element is uncovered by the insulating layer. A conformal shielding layer is deposited over the insulating layer and in contact with the uncovered portion of the at least one ground element. The shielding layer is a precursor material filled with a first and a second plurality of particles, wherein the first plurality of particles is selected to attenuate electromagnetic signal frequencies within a first range and the second plurality of particles is selected to attenuate electromagnetic signal frequencies within a second range of frequencies which is at least partially exclusive of the first range.

DETAILED DESCRIPTION OF A PREFERRED EMBODIMENT

The present invention utilizes a particulate-filled polymer system as an EMI shield, wherein the particulates used as fillers are chosen to attenuate a specific EMI frequency range or ranges, as determined by the needs of a given environment. The polymer system uses highly conductive metal, ferromagnetic conductive metal, insulative and lossy dielectrics, and/or ferromagnetic materials with low to high volume resistivities as fillers. Various filler types can be mixed with a polymer to form one general purpose EMI shield coating. Alternatively, multilayer coatings can be formed, wherein each layer may be formulated to contain specific mixtures of fillers to target specific E or H field frequencies for attenuation. The layers comprising the multilayer structure are applied in a sequence designed to protect the underlying sensitive circuit from impinging EMI, or to prevent EMI from being emitted from a noisy circuit. The two types of structures, general purpose or multilayered, may be formulated to attenuate a broad spectrum of EMI without knowledge as to what EMI frequencies may impinge the device or circuit or which may radiate from the noisy circuit component. Alternatively, the coatings can be specifically formulated to provide high attenuation of specific field types and frequencies which are being radiated or being received by a sensitive circuit. The prior art of bulky metal sheet shields and the inadequate shielding of thin film coated plastic system enclosures is replaced in the present invention by a highly efficient, low mass shield coating(s). Portable electronics will benefit from such EMI shielding, allowing lower mass and smaller size. Direct application of such coatings over printed circuit boards (PCBs) populated with active devices will reduce crosstalk between long parallel conductors.

In the general purpose structure, an emitting or sensitive receiving circuit is first coated with a thin layer of an unfilled, highly insulative, polymer. Then, a second coating layer is applied. This second layer is compounded to be a general purpose, broad spectrum shield material. The second layer should be highly electrically conductive in order to conduct away the current induced in the layer by the absorption of the fields. High conductivity (low impedance) also permits a high degree of reflection of the high impedance E-field components of the impinging field due to the great difference in field and shield layer impedances. It should also contain dielectric materials which are highly lossy at E-field frequencies present in the EMI field. The second layer may also contain ferromagnetic materials which are lossy at H-field and E-field frequencies present in the EMI. The high permeability of the ferromagnetic fillers will couple the H-field components via the establishment of a level of magnetism, and conduct the field lines away from the device. Conductive ferromagnetic materials are also useful in a general purpose shield layer due to their efficiencies in coupling H-field energy while aiding in the creation of a low resistance path for the conduction of induced currents out of the system to ground.

In the multilayer embodiment, once again a highly insulative polymer coating is first applied to an EMI emitting or EMI receiving circuit. Next, a series of individual coatings are applied, each chosen to shield a specific subset of interference frequencies. For example, a second layer may be formulated to be highly electrically conductive through the use of highly conductive filler particles. Highly conductive ferromagnetic powders can also be added to increase the permeability of this layer, thereby increasing shield absorption of impinging fields. A third layer could be designed to absorb E-field radiation by incorporating powders which are highly lossy at the E-field frequencies in the EMI field. A fourth layer could be formulated to attenuate H-fields frequencies through use of ferromagnetic powders which are highly lossy at these frequencies. A fifth highly conductive layer, similar to the second layer, may be desired as the external layer in order to reflect the bulk of the impinging E-field energy, and to permit conduction of any induced currents. The number and sequence of these layers can be modified to best optimize the structure to provide either protection from external fields, or to prevent emissions from being radiated from the coated circuit, depending on a particular system's requirement for shielding.

In both embodiments, general purpose and multilayered, ground planes, ground rings, or smaller ground connections may be dispersed about the surface or the periphery of the device to be shielded. In the case of shielding a printed circuit or wiring board (PCB or PWB), etched copper conductor features that are connected to ground may be present on the surface of the PCB. A first, highly insulative, polymer layer will not cover these ground potential elements. All of the layers applied subsequent to the pure polymer layer will have sufficient electrically conductive filler, along with the E-field and/or H-field absorbing fillers, so that all layers will be able to conduct induced currents to ground, either through a direct connection or indirectly through underlying layers. The ground connections used for sinking the EMI noise currents preferably are connected to system ground far away from power supply ground connections to active devices. If this is not done properly, the EMI noise that is routed to ground, preventing system noise, may reintroduce noise into the system via the power supply system ground, significantly degrading net shield effectiveness.

Figure 1:
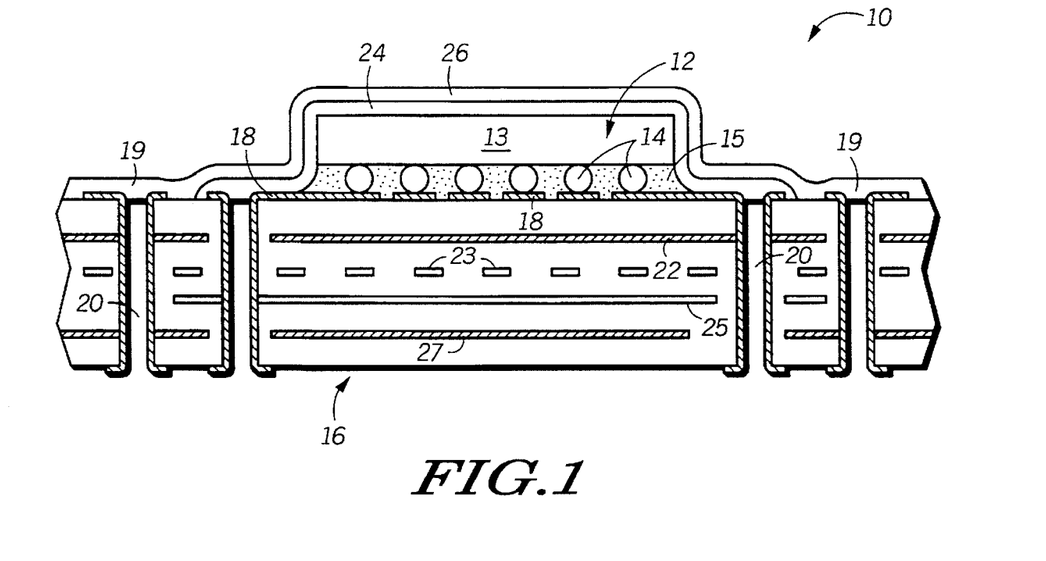
FIG. 1 is a cross-sectional view of a portion of a shielded electronic assembly in accordance with the present invention, as viewed along the line 1—1 of FIG. 2.
Figure 2:
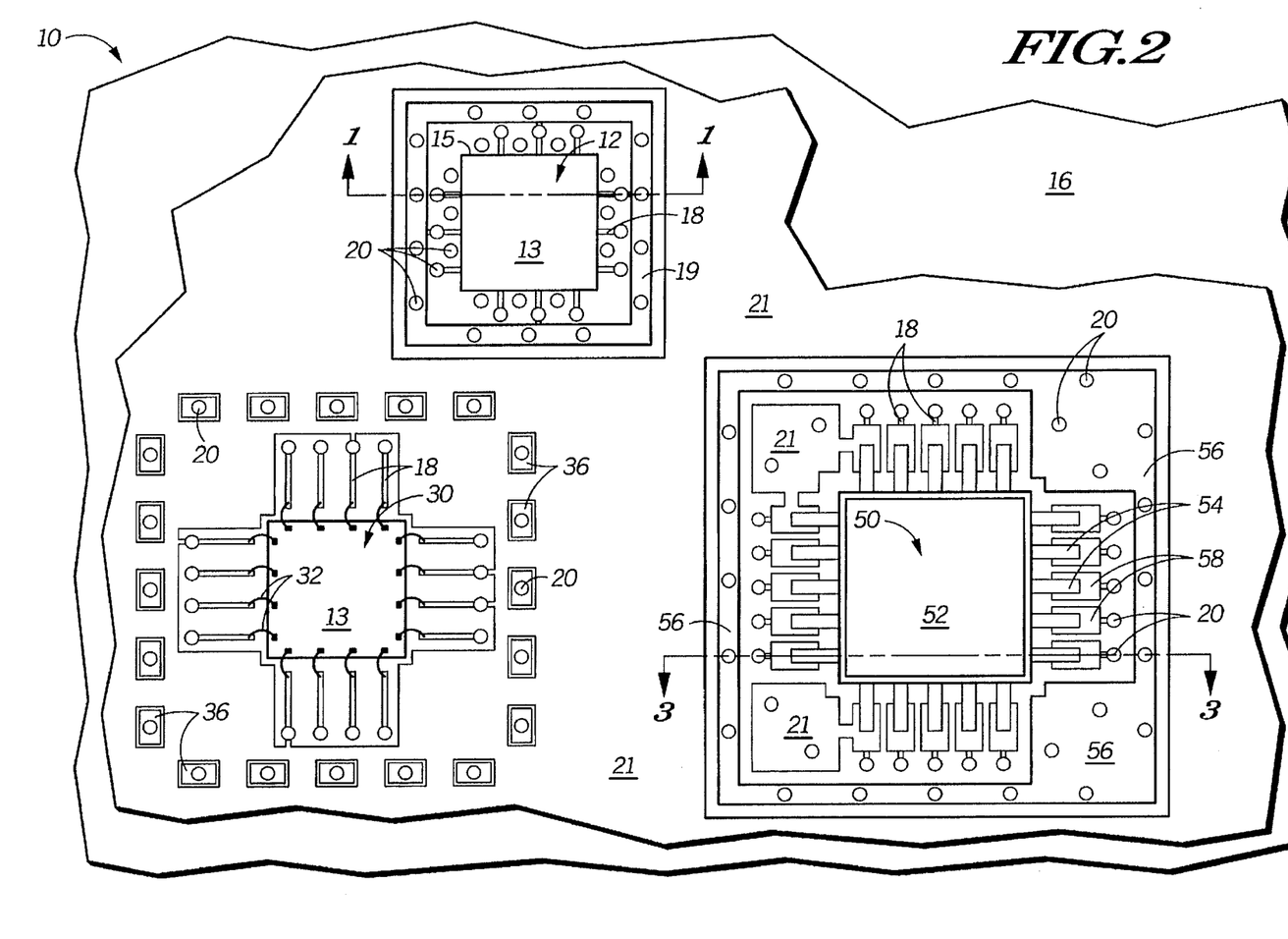
FIG. 2 is a top-down view of a larger portion of the electronic assembly of FIG. 1, withput shielding layers being illustrated.

Examples of a general purpose embodiment and a multilayer embodiment of the present invention are illustrated in FIGS. 1–4. FIG. 1 is a cross-sectional view of a shielded electronic assembly 10 in accordance with the present invention. Electronic assembly 10 includes a semiconductor device 12. Device 12 has a semiconductor die 13 which is connected to an underlying wiring substrate 16 by a plurality of solder balls 14. Solder balls 14 may be formed on an active surface of die 13 using one of any known bumping procedures. The solder balls act as electrical input/output (I/O) connections to conductive traces or pads 18 of the substrate. Substrate 16 can be formed from a printed circuit board (PCB), a flexible circuit, a ceramic substrate, a thin-film multichip module substrate, or similar substrate material. Furthermore, substrate 16 may be a rigid or flexible support for electronic components. Substrate 16 also includes an EMI ground ring 19. FIG. 2, which is a top view of assembly 10, more clearly illustrates the ring shape of the EMI ground ring. FIG. 1's cross-sectional view is taken along the line 1—1 of FIG. 2. Substrate 16 also includes plated through-holes 20, also known as vias, for routing selected traces, ground rings, pads, or the like, to internal conductive layers or planes. As illustrated, substrate 16 includes several internal conductive layers, specifically an X-direction signal layer 22, a Y-direction signal layer 23, a power plane 25, and an EMI ground plane 27. Through-holes 20 extend through substrate 16 to contact appropriate internal conductive layers. For instance, as illustrated in FIG. 1, EMI ground ring 19 is connected to the EMI ground layer 27 by through-hole 20. Conductive traces or pad 18 are connected to appropriate internal signal layers 22 and 23 or power plane 25.

As illustrated in FIG. 1, Device 12 is attached or mounted to substrate 16 by a direct chip attach (DCA) method, such as those known in the art. DCA of die 13 to substrate 16 includes the application of an underfill material 15 between the die and the substrate. Underfill material 15 is initially dispensed about the perimeter of die 13. Surface tension and surface energy effects cause underfill material 15 to be drawn under the die 13, where all air is displaced and the material 15 wets all contacted surfaces. Subsequently, the assembly is processed to effect the cure of underfill material 15, whereupon the material adhesively bonds die 13 to substrate 16. Underfill material 15 provides substantial mechanical reinforcement of die 13 to substrate 16 assembly, reducing the stress transferred to solder balls 14 during subsequent processing and the temperature cycling to which the assembly is exposed during testing and product usage. Underfill material 15 can also provide for environmental protection of the interconnect balls 14 and the circuitry on die 13. Particular materials suitable for use as an underfill material in accordance with embodiments of the present invention include those already commercially available for such purpose.

In accordance with the present invention, after die 13 is properly attached to substrate 16 and the appropriate electrical connections to the substrate are made, a conformal insulative layer or coating 24 is dispensed and cured over the die and other regions of substrate 16 which will be shielded to prevent emission or coupling of EMI. Coating 24 is applied directly on the die and portions of the substrate to prevent electrical short circuiting to a subsequently deposited conductive layer(s). Thus, coating 24 should be a highly insulative material. A secondary purpose of layer 24 is to increase the reliability of device 12 by increasing resistance to environmental stresses. Coating 24 in a preferred embodiment is a pure polymer having a low modulus of elasticity, such as a silicone gel or elastomer, polyurethane, epoxy, polysiloxane, acrylic, and the like. Coating 24 could also be a filled polymer system where the particulate filler was a highly insulative material such as specific ferrite and/or ceramic dielectric material. Coating 24 may be applied by syringe dispensing, spraying, dip-coating, curtain coating, screen or stencil printing, or by any other appropriate means. In order to avoid coating circuit regions which are to be left uncoated, in other words those to which contact by the subsequently deposited conductive layer is required, it may be necessary to remove the coating 24 from such regions through photolithographic, laser processing, mechanical ablation, or other appropriate means. For example, as illustrated in FIG. 1, ground ring 19 should be uncoated by insulative layer 24 so that contact between the ring and a subsequently deposited shield layer 26 (described below) can be made.

In a preferred embodiment for a portable electronics application, coating 24 will generally range in thickness from 1 to 250 μm; however, this range is not intended to limit the invention since other applications may require thinner or thicker coatings. If surface conductors, such as signal traces, are in direct contact with coating 24, the effect of added capacitance should be considered in the electrical design of the system since the characteristic impedance and capacitive line loading would be affected. These considerations may demand that coating 24 be a pure polymer system (without fillers) which would add minimal capacitance to the exposed conductor lines. Furthermore, any fillers with are incorporated in coating 24 must be chosen so as not to attenuate the principal frequencies of the signals running through the system conductors, such as signals through conductive lines or pads 18.

Next, a shielding layer 26 is deposited over insulative coating 24 of the assembly and in contact with EMI ground ring 19, as illustrated in FIG. 1. Shielding layer 26 is a particulate filled conformal coating. Like coating 24, shielding layer 26 may be applied by syringe dispensing, spraying, dip-coating, curtain coating, screen or stencil printing, or any other appropriate means. Likewise, any portions of substrate 16 or device 12 which are to be left uncoated by shielding layer 26 may be processed so as not to coat undesired surfaces, or material 26 may be removed from the desired areas by photolithographic or laser processing, mechanical ablation, or equivalent methods. Having shielding layer 26 deposited across the entire assembly should not pose problems if the appropriate underlying devices are protected by insulative coating 24. Generally, shielding layer 26 will to deposited to a thickness of about 5–500 μm, although other applications may dictate thinner or thicker coatings.

In the embodiment illustrated in FIG. 1, shielding layer 26 is a general purpose EMI shield material which incorporates a variety of filler materials for attenuating a broad range of frequencies which may impinge device 12. Preferably, the shielding layer is a polymer precursor material with filler materials selected to attenuate a specific frequency or range of frequencies estimated to be an EMI problem in a given system and environment. One or more filler materials may be used. In using more than one type of filler material, the attenuation characteristics of the materials preferably attenuate either exclusive or at least overlapping EMI frequencies to enhance shield effectiveness. For instance, one filler material may be chosen to attenuate E-field frequencies and another filler material for H-field frequencies. The filler particle size distributions and morphologies can be specified to provide the desired particle packing and fill volume in the shield layer. Further, if the wavelengths of the impinging radiation are known, the particle sizes can be adjusted to cause scattering and diffraction of the impinging radiation. As a general purpose EMI shield, layer 26 should contain, at least, particulate fillers which impart high electrical conductivity, such as Cu, Ag, and alloys of these metals, among others, to allow induced currents to be conducted away from the circuit. As a general purpose shield, layer 26 may include additional fillers of some or all of the following general types of particulate fillers: conductive and ferromagnetic metals such as Ni, Co, Fe, Fe/Co alloys, Fe/Ni/Co alloys, and other alloys of these metals; lossy ferrite materials such as Ni ferrite or Mn ferrite, or magnetic oxides; or dielectric materials such as barium titanate, strontium titanate, niobate materials, zirconate materials, or magnetic oxides, among others, which are lossy at the frequencies of the EMI.

To allow induced currents to be conducted away from the circuit. shielding layer 26 must be electrically connected to a reference potential, such as ground potential. As illustrated in FIG. 1, shielding layer 26 is in direct contact, and therefore electrically coupled to, EMI ground ring 19 of substrate 16. The ground ring is coupled to internal EMI ground plane 27 by one or more plated through-holes 20. Ground ring 19 need not be in the form of a ring surrounding the device, as will become apparent below in the discussion of FIG. 2. It is preferable that ground ring 19 is connected to an EMI ground plane 27 which is not used for general power supply distribution (e.g. ground) for device 12. This is to prevent power supply noise from coupling into the shield, and to prevent EMI-induced signals in the shield from coupling into the power supply system. The introduction of power supply noise into shielding layer 26 layer may cause EMI to radiate from the shield into die 13. Independent grounding of shielding layer 26 will also help to prevent currents in shielding layer 26, induced by coupled EMI, from entering the device's power supply system where the EMI-induced current could add to system noise.

FIG. 2 is a top-down view of a larger portion of electronic assembly 10, illustrating various electronic components and semiconductor devices which can be shielded in accordance with the present invention. As illustrated in FIG. 2, no shielding layers are present so that the devices and substrate features are apparent. FIG. 2 shows three types of integrated circuit devices which are commonly mounted on the surface of a substrate, such as substrate 16, one of which is device 12 as described above in reference to FIG. 1. It is important to note, however, that FIG. 2 does not illustrate all possible types of electronic components which may be shielded by the current invention. The present invention may be used for all types of components and interconnect circuitry which may comprise an electrical system.

As demonstrated in FIG. 2, ground ring 19 surrounds device 12 on the surface of substrate 16. Surrounding ground ring 19 is a power supply ground plane 21 formed on the surface of substrate 16. As discussed above, the ground reference for EMI shielding and that for power distribution within the device are independent. Thus, power supply ground plane 21 is distinct from EMI ground plane 27. Power supply ground may be coupled to selected conductive traces 18 for device 12 by through-holes in plane 21 (not illustrated) which are connected to appropriate device signal lines or traces. If incorporated into a substrate, the power supply ground plane should extend to the extent necessary to supply controlled impedance to high speed signals of device 12 or other devices of assembly 10. As an alternative to an internal EMI ground plane and an external power supply ground plane to create independent ground references, the layers could be reversed such that EMI ground is a surface plane and the power supply ground plane is internal. Moreover, both planes could be formed independently internally to or on the surface of the substrate.

A second device 30 is also included within assembly 10. Device 30 includes a semiconductor die 13 connected to conductive traces 18 by a plurality of wire bonds 32. Plated through holes 20 connect conductive traces 18 to internal reference or signal planes (not shown in FIG. 2). Surrounding device 30 is a plurality of EMI ground pads 36 which are each coupled to the internal EMI ground plane (not shown in FIG. 2) by through-holes 20. Ground pads 36 demonstrate that ground contacts for EMI shielding can take forms other than the ring configuration used in device 12. Configurations other than pads may also be used. Whatever configuration is used may be of any size or shape, and can be arranged in any location or pattern which optimizes the conduction of EMI-induced noise away from the system. Ground pads 36 are electrically independent from power supply ground plane 21, as described above and as illustrated in FIG. 2. In depositing a shielding layer over device 30 in accordance with the present invention, ground pads 36 would be in direct contact with the shielding layer, whereas other portions (including system power distribution ground plane 21) would be insulated from the shielding layer by an insulator, such as coating 24. Also note that in device 30, power supply plane 21 is brought in as close to die 13 as possible. Having the power supply plane in close proximity to the die minimizes inductance. An additional benefit of bringing the power supply ground plane 21 so close to the die is that selected conductive traces 18 of device 30 may be connected to plane 21 on the surface, as illustrated in FIG. 2, rather than having to connect the two by through-holes.

Assembly 10 as illustrated in FIG. 2 includes a third device 50, which is a packaged integrated circuit surface mounted to substrate 16. As illustrated, device 50 has a package body 52 in the form of a plastic molded quad flat pack, commonly known as a PQFP, although other package types may instead be used (for instance, a ceramic package). Extending from the periphery of package body 52 is a plurality of conductive leads 54 which are attached and electrically coupled to a plurality of corresponding contact pads 58 by solder or other suitable means. The contact pads are then routed to through-holes by conductive traces 18. The leads are electrically coupled to a semiconductor die (not shown in FIG. 2) internal to package body 52. Surrounding device 50 is an EMI ground ring 56 similar to ground ring 19 of device 12. Ring 56 demonstrates that the EMI rings, pads, or the like may also be brought in close to the device in corner regions. The closer the EMI ground comes to the device the greater the probability that the inductive noise in this plane will be minimized. This plane will run in parallel with any EMI shield layers applied over device 50, aiding in the conduction of induced noise to a distant ground. Since the EMI ground plane formed on the substrate 16 will typically be of high conductivity copper, the lower resistance afforded by the close proximity of the EMI ground to the device 50 will further aid the conduction of induced noise to a distant ground. The EMI ground ring also includes through-holes 20 for connecting to an internal EMI ground plane. Again, EMI ground ring 56 is preferably electrically isolated from power supply ground plane 21. Additional power supply ground plane segments are placed in the left corner regions of device 50 so that selected conductive traces 18 may be tied into the plane of the surface of the substrate rather than by through-holes.

Figure 3:
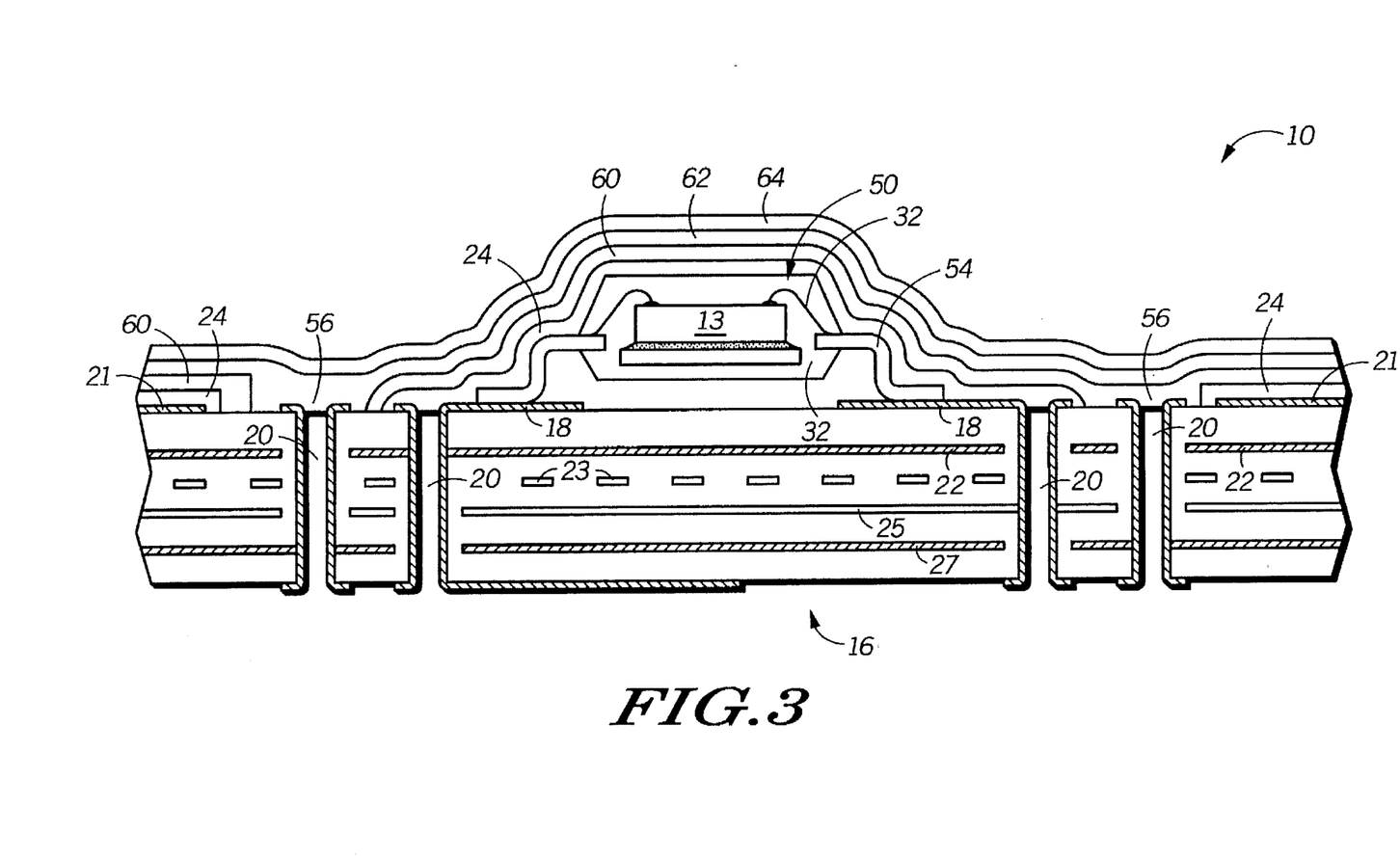
FIG. 3 is a cross-sectional view of a portion of another shielded electronic assembly in accordance with the present invention which includes multiple shielding layers, as would be viewed in a cross-section along the line 3—3 of FIG. 2.

FIG. 3 is a cross sectional view through device 50 taken along line 3—3 of FIG. 2. FIG. 3 illustrates the shielding of device 50 with a multilayer embodiment of the present invention rather than a single general purpose shielding layer. Although device 12 is illustrated in FIG. 1 as being shielded by a single layer, and device 50 is illustrated as being shielded by multiple layers, it is noted that the particular type of shielding arrangement chosen will depend upon the needs of particular devices. Furthermore, the entire assembly 10 may be shielded with a single layer or a multilayer configuration, rather than have individual devices shielded with different configurations.

A first layer overlying device 50 is insulative coating 24, as described above. Unlike in device 12, coating 24 is also present beneath the device since device 50 is a packaged device rather than a DCA device. Coating 24 is deposited to leave EMI ground ring 56 uncovered while coating all other elements (including power supply ground plane 21). Over coating 24, a first shielding layer 60 is deposited so that layer 60 is in contact with EMI ground ring 56. In a preferred embodiment, layer 60 is a filled polymer, wherein the filler material(s) are selected for the reflection and/or attenuation of specific frequency ranges of incident E- and/or H-fields. Deposited over first shielding layer 60 are second and third shielding layer 62 and 64, respectively. Layers 62 and 64 are likewise specifically formulated with filler materials which exhibit attenuation characteristics desired for one or more specific frequency ranges. Preferably, filler materials for each of layers 60, 62, and 64 are chosen such that the attenuation frequencies for each of the layers is at least partially exclusive of one or more of the other layers for maximized shield effectiveness. It is also preferable to have the outermost shielding layer be highly reflective of the predominant EMI component (E-field or H-field). For example, in a high speed digital environment where the EMI would be E-field intensive, it is desirable to have the outermost shielding layer be a highly conductive, low impedance layer to reflect the bulk of the E-field radiation.

The number of layers shown in FIG. 3 is not meant to specify or limit the invention, as smaller and larger numbers of layers may be appropriate for other applications. Coating 24 will generally range in thickness from 1–250 µm in a preferred embodiment. The thickness of each of the layers 60, 62, and 64 will generally be from 5–500 µm in a preferred embodiment for use in a portable electronic product, although other applications may require thinner or thicker layers. Materials 60, 62, 64 may be applied by syringe dispensing, spraying, dip-coating, curtain coating, screen or stencil printing or any other appropriate means. In order to avoid coating circuit regions which are to be left uncoated, it may be necessary to remove the material from such regions through photolithographic processes, laser processing, mechanical ablation, or other appropriate means. An example of when one or more shielding layers may need to be removed from an area, or deposited so as not to cover an area, is demonstrated in the left portion of FIG. 3. As shown, shielding layer 60 does not cover ground ring 56 or the left most through-hole 20 in the left portion of FIG. 3. This allows subsequently deposited shielding layer 62 to be in direct contact to ground ring 56. In contrast, shielding layer 62 in the right portion of FIG. 3 is only coupled to ground ring 56 indirectly, through intervening shielding layer 60. The presence of intervening layers may degrade the effectiveness in shielding EMI of a particular layer (for instance, the contact resistance to the ground element may be increased by layer interfaces), thus there may be applications where direct contact between the various shielding layers and the EMI ground reference element is desirable. Moreover, it may also be desirable for shielding layers to be connected to different and independent ground sources, much like the preferred embodiment wherein the electronic device uses a power supply ground which is independent from EMI ground.

Figure 4:
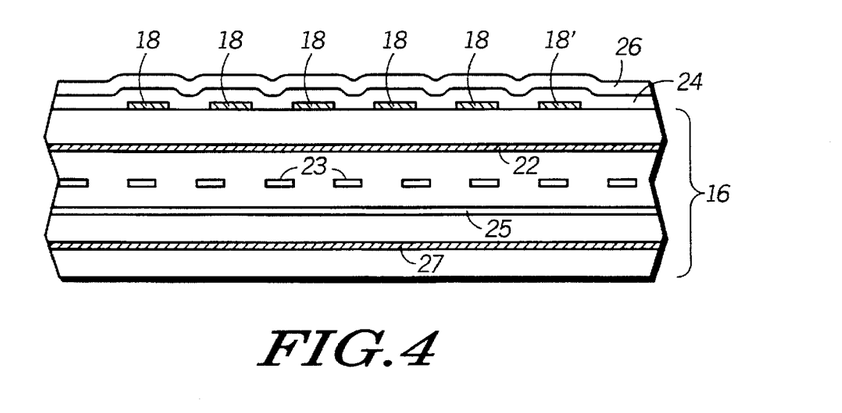
FIG. 4 is a cross-sectional view of conductive traces of a substrate shielded in accordance with the present invention.

FIG. 4 illustrates yet another embodiment of the present invention in which a general purpose or multilayer shielding structure in accordance with the present invention is utilized to lower inductance and cross-talk in adjacent single lines. FIG. 4 is a cross sectional view of a portion of substrate 16 through a plurality of conductive traces 18. Traces 18 are approximately 15 µm thick and 75 µm wide, with 50 µm spaces between them. Crosstalk noise is mainly caused by the inductance of an active line. If an outer trace 18' is active, and all the other five traces 18 are quiet, it is quite common for the active line to be able to induce noise in all of the remaining five quiet traces. The level of noise induced in the five quiet traces 18 decreases with distance from the active trace 18'. High frequency surface conductors often require controlled impedance transmission lines to prevent system noise due to impedance discontinuities. One method to achieve this involves the placement of a reference plane as the first conductive layer under the external metal layer used to form traces 18 and 18'. The resulting structure is known as a microstrip structure, or if a solder resist is coated over the external metal layer, the structure is referred to as an embedded microstrip structure. In accordance with the present invention, conductive traces 18 are coated first with insulative coating 24 and then with one or more conformal shielding layers 26, as shown in FIG. 4. As a result, crosstalk between active trace 18' and the remaining quiet traces 18 will be reduced, without the presence of an internal reference plane closest to the top surface of substrate 16, since the inductance of active trace 18' is reduced by the presence of shielding layer 26. Shielding layer 26 will also act as a reference plane to traces 18. The construction shown in FIG. 4 thus reduces internal radiated noise coupling (crosstalk)

while reducing the amount of radiated noise and coupled noise from incident EMI, because the resulting structure, comprised of shielding layer 26 and conductive traces 18, is effectively microstrip transmission line. Designers will need to consider the effect of adding this shielding layer(s) 26 to make certain that the desired impedance is attained.

Figure 5:
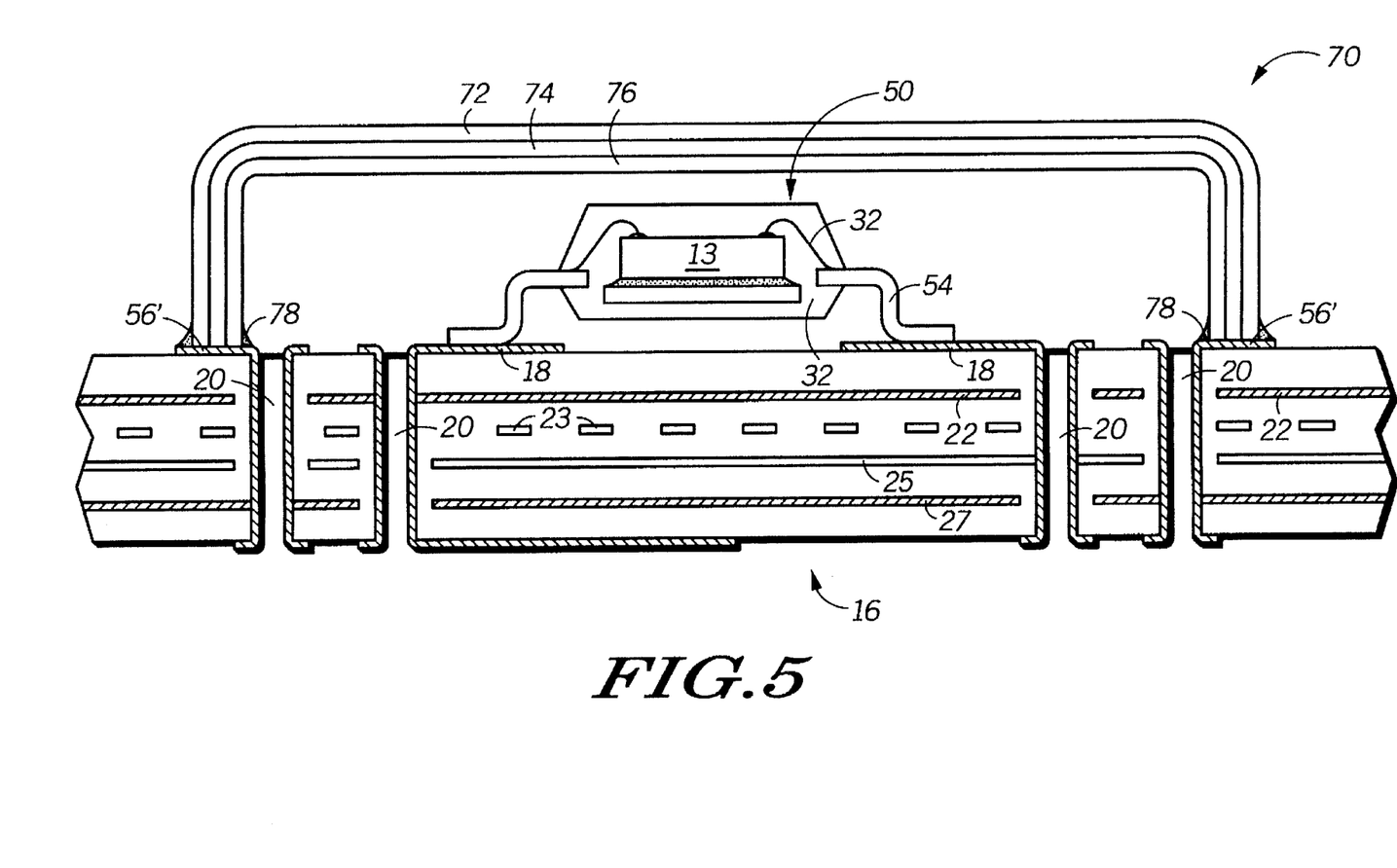
FIG. 5 is a cross-sectional view of yet another electronic assembly which includes a shielded housing in accordance with the present invention.

Another application of the present invention includes the use of general purpose or multilayer shielding layers on interior surfaces of electronic system cabinetry or housings (e.g. inside computer cabinets, or telecommunication switching system enclosures; cellular phone, paging, or other wireless communication casings; and the like). FIG. 5 is an example of how the present invention might be implemented in such an application. FIG. 5 is a cross-sectional view of a housed and shielded electronic assembly 70 in accordance with the present invention. For ease of explanation and illustration, assembly 70 includes previously described substrate 16 and device 50. Device 50 and portions of substrate 16 are enclosed within a housing 72. It is noted that the present invention as used in conjunction with system housings is not limited to shielding only one packaged device as illustrated. For example, the housing may enclose an entire family of PCBs within a computer system, and protect packaged and unpackaged electronic components alike. In portable electronic applications, housing 72 is preferably plastic or other lightweight material. A metal housing will aid in EMI shielding, but will also add considerable weight to the assembly. Thus, to achieve highly effective shielding with minimal weight increase, a light weight housing is coated with one or more shielding layers in accordance with the present invention. As illustrated in FIG. 5, interior surfaces or walls of housing 72 are coated with shielding layers 74 and 76. In shielded housing applications, a insulative base coat (e.g. coating 24) may not be necessary since there is generally no circuit formed on the cabinet surface which must be insulated. Shielding layers 74 and 76 are formulated similarly to previously described shielding layers (wherein one shielding layer includes particles selected to attenuate one range of EMI frequencies and the other layer includes particles selected to attenuate another range of frequencies at least partially exclusive of the first range). To effectuate the shield, the layers are electrically coupled in some manner to ground potential. As illustrated, shielding layer 76 is electrically coupled to ground ring 56' by means of solder 78. Other electrical coupling methods may instead be used. Likewise, each individual shielding layer may be directly coupled to the ground reference. Although illustrated in a multilayer embodiment in FIG. 5, a general purpose shielding layer may also be used in a housing application.

Furthermore, benefit may also be achieved in using the present invention in conjunction with conventional metal cabinets or conductor-filled electrically conductive plastic cabinets used for electrical system enclosures. The general purpose or multilayer shielding layers disclosed herein may be applied directly to the electrically conductive cabinet, forming a very low ohmic resistance contact between the cabinet and shielding layer(s). The shielding layer(s) would be formulated to attenuate EMI which the metal cabinet could not attenuate. The same low resistance ground contact path could be used for the cabinet material and the shield layer(s), or independent grounding connections could be used for each material structure. An independent ground connection approach will be very desirable where low ohmic resistance contact cannot be made, or maintained at a low level during system life. In either case, the use of multiple ground connections is recommended so as to provide the shortest distance, lowest resistance, connection to final ground in order to minimize ground inductance and resistance.

Yet another application of the present invention (although not illustrated) is use of shielding layers in conjunction with flexible substrates, such as flexible circuits and cables. Since the shielding layers in accordance with the present invention may be compounded with low modulus polymers as the matrix phase or precursor material, the shielding layer can be quite flexible. This flexible property makes the conformal shield layers compatible with planar processing through manufacture, followed by subsequent use in a folded or twisted configuration. The flexibility of the conformal shield is highly dependent upon the properties of the base polymer system. The flexibility is also proportional to the polymer content of the coating, and inversely proportional to the total coating thickness. If the proper tradeoffs are made with filler loading level and total conformal shield thickness, it is possible to use the conformal shield of this invention to coat a cable (e.g. a ribbon cable) or flexible circuit which undergoes frequent flexing in the normal operation of the electronic product in which the shield-coated flexible element is embedded.

Considerations in Choosing Suitable Filler Materials for the Shielding Layers Efficiency of shielding is a strong function of the electrical and magnetic properties of the materials used in the shield and the characteristics of the impinging field. Electromagnetic fields can be described by the wave impedance ($Z_w$) which is the ratio of the magnitudes of the E- and H-field components ($Z_w=E/H$). Field sources which conduct relatively high currents at low voltages are low impedance sources. Such sources may be power supply loops, transformers, and electric motors. Fields radiated from such sources have low $Z_w$ values, hence the ratio of E-field to H-field intensity is low. Integrated circuits (ICs) operate at relatively high voltages compared to the currents driven, and as such are considered high impedance signal sources. Such signals have high $Z_w$ values due to a high E-/H-field intensity ratio. At large distances, the $Z_w$ value from either a low or high impedance source is the same, and is equal to 377 ohms, the impedance of free space. Waves with such an impedance value are called plane waves.

When an electromagnetic field wave front impinges upon a shield structure, the field can be reflected, absorbed, or transmitted. The wave impedance ($Z_w$) of the impinging field is equal to the ratio of the E-field component to the H-field component. Consequently, high impedance fields have high E-field intensities, and low H-field intensifies. Low impedance fields have low E-field intensities, and high H-field intensities. The E-fields are considered to have high impedance, while H-fields are considered to have low impedance. If the impedance of the impinging field is considerably different than the impedance of the contacted shield surface, the field will be largely reflected. If the impedances of the field and the shield are similar, the field will be reflected less, and absorbed more.

If the shield was infinitely conductive, an equal and opposing field would be established in the shield, and the fields would cancel, demonstrating perfect shielding. No non-superconductor is infinitely conductive, so no conductor is capable of perfect shielding. Accordingly, a portion of the field frequency components would be reflected from the outer surface of the shield. Another portion would be absorbed by the grounded shield, inducing current flow to ground. Another portion would reflect off the inner shield surface and back into the shield bulk thickness. As the field penetrates the shield material, the field intensity is attenuated as current flow is induced in the shield. The current flow in each hypothetical layer of shield thickness decreases as a function of the shield material conductivity and permeability. If the shield is not thick enough, or the conductivity and permeability are not high enough, residual current flow will exist on the inner surface of the shield. This residual current will establish an internal field which will radiate onto the mag-sensitive parts within the shield, inducing system noise.

Shielding efficiency is the sum of the field intensity reflected by the initial surface contacted by the field, the field absorbed by the shield, and the field reflected back into the shield bulk by the other surface of the shield. The efficiency of the shield (SE) can be expressed as follows:

$$SE=R+A+B,$$

where

R=reflection coefficient (dB)

A=absorption coefficient (dB)

B=internal surface reflection term (dB).

All the components of SE are dependent upon the properties of the shield materials as shown below. The E- and H-field components of the impinging field are reflected independently, and the reflection of the two components show different material property dependencies. The E-field reflection coefficient ($R_E$), H-field reflection coefficient ($R_H$), and plane wave reflection coefficient ($R_P$) are calculated as follows:

$$R_E = 353.6 + 10 \log_{10}(G/f^3\mu r^2),$$

$$R_H = 20 \log_{10}\{(0.462/r)(\mu/Gf)^{1/2} + (0.136r)(fG/\mu)^{1/2} + 0.354\},$$

$$R_P = 108.2 + 10 \log_{10}[(G)(10^6)/(\mu f)],$$

where

G=shield material conductivity relative to copper f=field frequency

μ=shield material relative permeability r=distance from the field source to the shield.

The absorption coefficient (A) is calculated as follows for all three field types:

$A=0.003338[t(\mu fG)^{1/2}]$, where t=shield thickness.

The internal surface reflection (B) is calculated as follows:

$$B = 20 \log_{10}|1-\{(K-1)^2/(K+1)^2\}(10^{-A/10})(e^{-j227A})|,$$

where

A=absorption coefficient losses (dB)

$K=|Z_S/Z_H|=1.3(\mu/fr^2G)^{1/2}$ $Z_S$=shield impedance $Z_H$=impinging magnetic field impedance.

As the above equation demonstrates, the internal surface reflection (B) is very small if the shield absorption is greater than about 6 dB. B can be significant when the shield is quite thin, and when the field is largely composed of low frequency components of 20 kHz or less.

Low impedance H-fields are readily absorbed by highly conductive, low impedance shield structures. In order to attenuate the magnetic field component (H), the shield should have high magnetic permeability. Permeability is a measure of a material's ability to carry magnetic field lines, or flux, under the influence of a magnetic field. Thus, a highly permeable material will conduct magnet field flux even under the influence of a very weak magnetic field. In order to conduct the magnetic field flux, the material structure must permit a level of magnetization within the microstructure through the establishment and alignment of magnetic domains. The ratio of the level of magnetization to the magnetic field strength is called the magnetic susceptibility. A material which possesses unaligned magnetic domains in the absence of a magnetic field is called ferromagnetic. Such materials are very readily magnetized, and have high magnetic susceptibility and permeability. Ferromagnetic materials, such as iron, cobalt, nickel, and alloys of these materials, and ceramic materials called ferrites, have a permeability greater than 1.0, meaning the material can carry a higher amount of magnetic flux than free space (which has permeability of 1.0). Since ferromagnetic materials couple H-field energy so readily, highly electrically conductive shields which are also ferromagnetic are quite efficient in shielding both E- and H-fields, since the induced current and magnetic flux are conducted away from the coupling site.

Materials which exhibit magnetic permeability will couple with a magnetic field, as exhibited by the level of magnetism attained in the material, thus conducting the magnetic flux. All magnetic materials are characterized by a magnetic saturation value. This represents the maximum magnetic flux density that can be conducted, regardless of the strength of the H-field. Therefore, fields which exceed the field strengths that establish the saturation flux density levels will penetrate the magnetic material shield. Accordingly, it is important to understand the intensity of the field to be screened. This will rarely be a problem when shielding a sensitive circuit from a distant EMI source. It could be a problem if an application requires shielding a strong H-field emitter at the source to reduce emissions from a system since the field intensity increases rapidly as the distance from a source decreases. Once flux saturation is exceeded, the shield must attenuate the field via electrical and magnetic loss mechanisms, where the field energy is thermally dissipated. It is desirable for the shield material to have high loss tangent and impedance values at the frequencies of the impinging field, allowing the thermal dissipation of the spectral energy.

With the general information discussed above in mind, one must choose which specific materials to incorporate into a shielding layer in accordance with the present invention. Generally, shielding materials will be chosen to shield from impinging E- and H- field radiation. To make a coating which is very reflective to high impedance E-field components of EMI, the polymer coating is made to be low impedance through the use of highly conductive fillers (such as copper, or silver) which will render the bulk coating highly reflective. Since the conductivity will not be infinitely high, some unreflected E-field, and most of the low impedance H-field will penetrate the shield. The E- and H-field components which penetrate the shield will need to be absorbed (via thermal dissipation) by subsequent shield elements, and/or reflected by subsequent shield layer interfaces. To aid absorption, it is desirable to have high permeability. The addition of particulate conductive materials with high permeabilities (such as cobalt, nickel, iron; or alloys such as steel, stainless steel, and Fe/Ni or Fe/Ni/Co) to the highly conductive coating will significantly increase the shield permeability.

Coatings designed to attenuate H-fields would require use of other types of materials, called ferrites. Ferrites are ceramic oxide based materials, characterized by their ease of demagnetization. Materials requiring high magnetic field strength (high coercive force) to demagnetize are called hard ferrites, while materials requiring relatively low field strength (low coercive force) are called soft ferrites. In order to function as a magnetic field attenuating material, the magnetization-demagnetization of a ferrite will need to be able to occur at the frequency of the impinging H-field. Since the impinging H-field is typically not strong enough to demagnetize hard ferrite materials, which are commonly used in permanent magnet applications, hard ferrites are not usually suitable shield materials. In the action of inducing and reversing the magnetization-demagnetization cycle in the microstructural domains of the soft ferrite, the inability of the material to perfectly follow the variations of the impinging field causes the thermal dissipation of the impinging H-field. Soft ferrites, with coercive force values much lower than hard ferrites, can maintain reasonable phase correlation with the impinging fields, dissipating energy as a function of how large the phase difference is.

Hard ferrite microstructures are commonly hexagonal, and consequently exhibit a strong crystal orientation preference when magnetized, as evidenced by a high magnetic force required for demagnetization. Soft ferrites have a cubic spinel crystal structure, and the more isotropic aspect of their microstructures allows easier (lower coercive force) alternating domain realignment when coupled with an incident alternating H-field. The action of domain realignment with the impinging H-field is a lossy mechanism (loss tangent), and as such the incident H-field energy is thermally dissipated in the soft ferrite. Soft ferrites can have very high resistivities of up to $10^9$ ohm-cm, so they can be quite good insulators. Ferrite chemistries can vary widely, but all soft spinel ferrites are based upon $Fe_2O_3$. Important ferrites for EMI attenuation are manganese-zinc ferrites (MZ), and nickel-zinc ferrites (NZ). NZ and MZ ferrites can have widely different magnetic permeabilities ($\mu$) and loss factors. Nickel ferrites can have '$\mu$' values of as low as 15, while MZ can attain values of 15000. The magnetic loss properties present high impedance to the H-field near the resonant frequency of the particular ferrite. Typically, materials with high permeability have resonant frequencies at lower frequencies, and materials with lower permeability values have resonant frequencies at higher frequency levels. Therefore, NZ ferrites (low $\mu$) are useful into high frequency regions in the gigahertz range, while MZ ferrites (high $\mu$) are useful at frequencies of less than 100 MHz. Frequency components significantly lower than the resonant frequency are not attenuated by the soft ferrite. Therefore, if the frequency of the radiated emissions are known via mathematical modeling or actual measurement made on a system, specific ferrite compositions can be selected.

Other possible materials suitable for use in coatings to attenuate E- and H-fields include the following:

| Metal Filler Material | Resistivity (μ-ohm cm) | Magnetic Susceptibility (x $10^{-6}$) |
|---|---|---|
| Cu | 1.678 | 5.46 |
| Mo | 5.2 | 89 |
| Fe | 9.71 | ferromagnetic |
| Au | 2.214 | −28 |
| Co | 6.24 | ferromagnetic |
| Rh | 4.51 | 111 |
| Ni | 6.84 | ferromagnetic |
| Ag | 1.586 | −19.5 |

-continued

| Metal Filler Material | Resistivity (μ-ohm cm) | Magnetic Susceptibility (x $10^{-6}$) |
|---|---|---|
| W | 5.65 | 59 |
| Ir | 5.3 | 25.6 |

In choosing appropriate filler materials, it is also important to keep in mind that the filler materials should not attenuate the principal frequency or frequencies of digital signals which will be propagating during system operation in conductive traces, leads, etc. that are also coated with the shielding layers. Further aid in selecting filler materials is obtained by reviewing material properties of candidate filler materials and making sure selected properties are compatible with the system in which the filled shielding layer(s) is intended to be used. FIGS. 6–10 demonstrate some properties which should be considered in selecting suitable filler materials. Review of these and other material properties is beneficial to ensure that inappropriate materials are not selected. If improper filler materials are selected, the incident EMI may not be adequately attenuated, and the propagating digital signal may be excessively attenuated.

Figure 6:
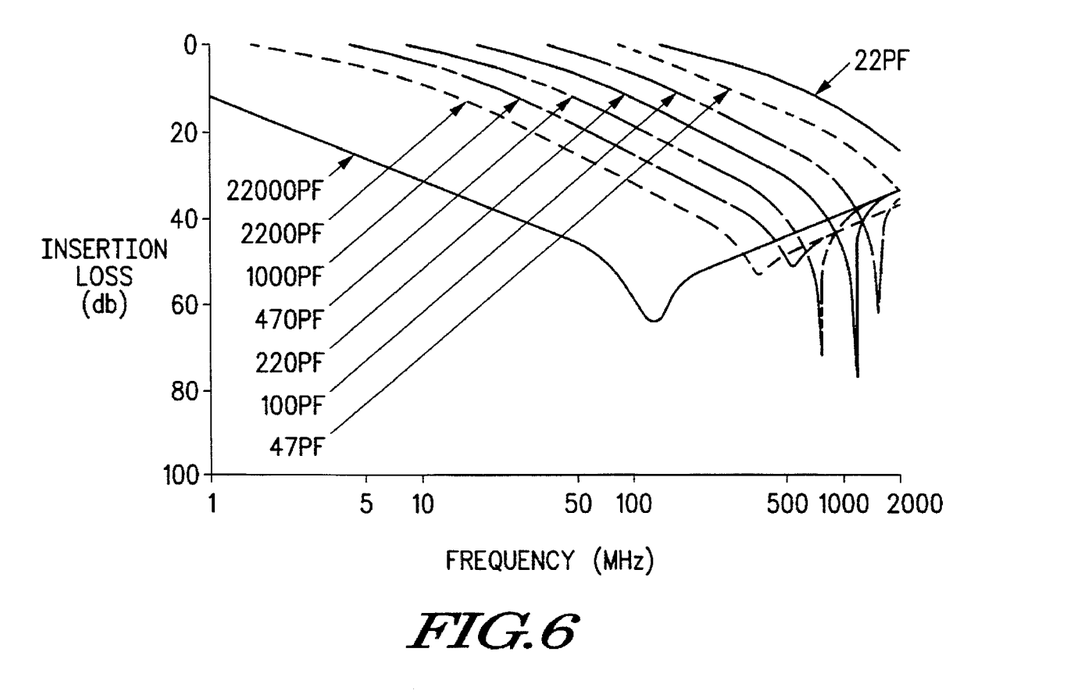
FIG. 6 is a graph showing the insertion loss (attenuation) characteristics of a typical capacitive EMI filter material as a function of frequency and the capacitance of the filter component.

FIG. 6 demonstrates typical insertion loss (attenuation) characteristics of a capacitive ceramic EMI filter as a function of frequency and the capacitance of the filter component. Ceramic dielectric materials are available with a broad range of dielectric properties, which show widely variable dependencies upon frequency and temperature. The behavior shown in FIG. 6 reflects the performance of a component with a fixed shape. The component shape, and the location and geometry of the electrodes will cause the component to have a characteristic inductance value, which will effect the function of the component on the attenuation of system noise. The use of a ceramic powder filler in a polymer-based EMI coating in accordance with the present invention, where the filler has the same or similar dielectric properties as the material in the filter component whose properties are illustrated in FIG. 6, will result in similar attenuation characteristics. If a designer knows at which frequency the E-field radiation is present, charts similar to FIG. 6 can be used to select appropriate filler materials. It is desired that the insertion loss of a component made of the filler material be high in the frequency range of the offending E-field radiation.

Figure 7:
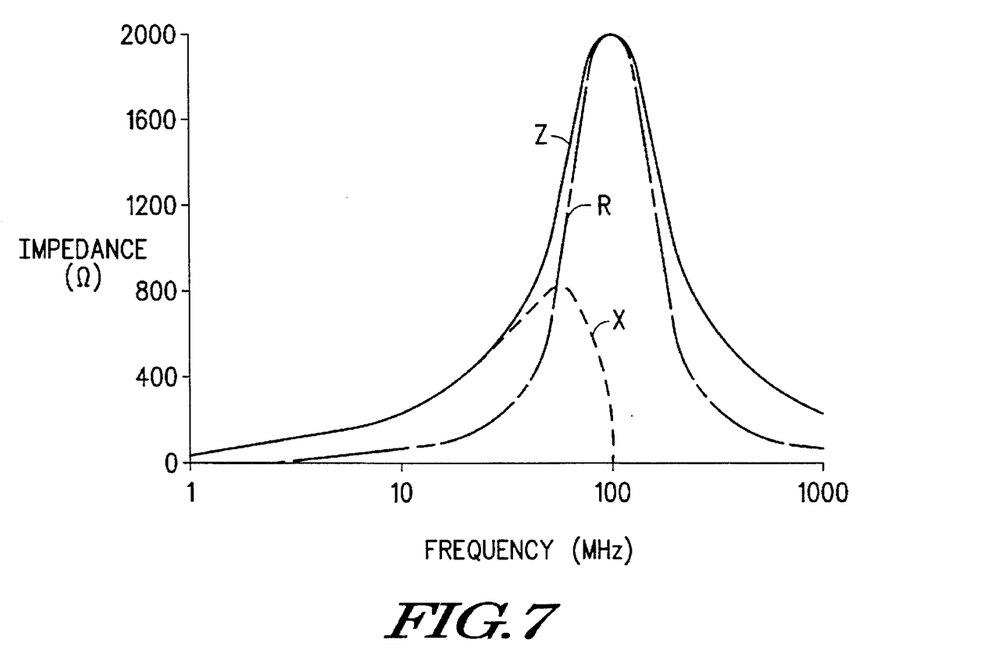
FIG. 7 is a graph demonstrating the idealized impedance of a typical surface mount ferrite component, and also indicating the resistive and reactive impedance components.

FIG. 7 is a graph demonstrating the typical impedance (Z) of a surface mount ferrite component as a function of frequency. The graph also shows resistive (R) and reactive (X) impedance components. The impedance is a measure of the level of EMI attenuation which is possible with a given material and component structure. In a broad sense, the impedance is a measure of the resistance to propagation of an impinging electromagnetic field. Typically, higher impedance values result when the shield mass is increased, and the distance from the source of EMI is decreased. Ceramic ferrite materials are available with a broad range of dielectric and magnetic properties which show widely variable dependencies upon frequency and temperature. The behavior shown in FIG. 7 reflects the performance of a chip component made of a ferrite with properties which optimize impedance at a particular frequency. To maximize attenuation of a specific frequency one would choose a material having high impedance at that frequency. Thus, the material used in the construction of the ferrite component demonstrated in FIG. 7 would be a good candidate for attenuation of noise spikes centered at or around 100 MHz and ranging from about 50 to 500 MHz. The ferrite material selected and the geometry of the component will affect the impedance relationship with frequency. The reactive component (X) is a function of frequency and inductance, and is especially effective at lower frequencies. The resistive component can be seen to continue to be very effective well after the reactive component has approached zero. The use of ceramic powder fillers in the polymer-based EMI coating with the same or similar dielectric and magnetic properties as the materials in the components whose properties are illustrated in FIG. 7 will result in similar attenuation characteristics.

Figure 8:
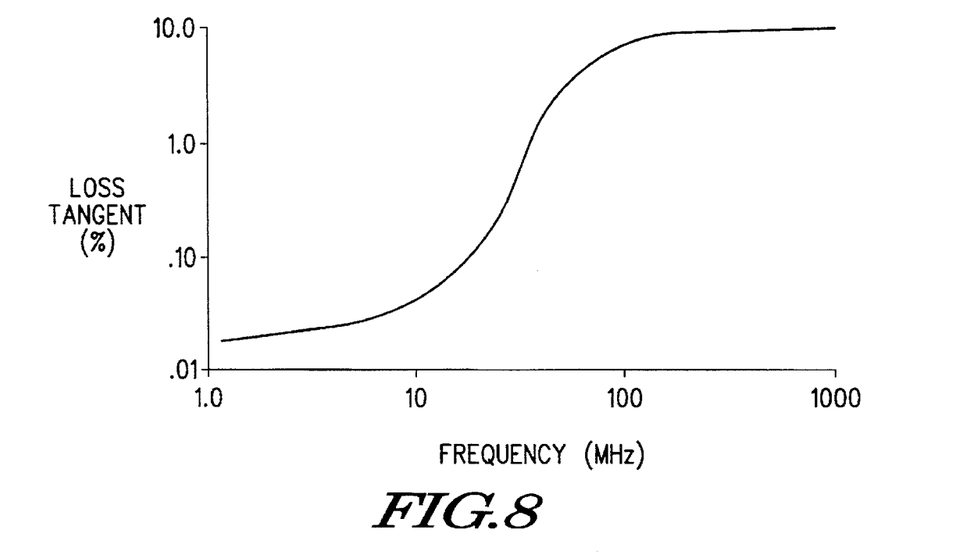
FIG. 8 is a graph illustrating the loss tangent as a function of frequency for a typical nickel-zinc, soft ferrite EMI shielding component.

FIG. 8 is a graph showing the loss tangent of a typical nickel-zinc, soft ferrite EMI shielding component. This loss tangent (also called tangent delta) is highly dependent upon the ferrite chemistry and microstructure, material temperature, and the frequency of the field. In choosing a filler material, it is preferable to chose a material having the highest possible loss tangent at the frequency(ies) of interest. A ferrite filler may be used in shield layers designed for high permeability to allow high flux density to be established in the shielding layer to conduct the field away from the sensitive circuit. If the shield layer is designed to absorb the field and thermally attenuate the field energy, it is desirable for this ferrite filler to have a high loss tangent and relatively low permeability.

Figure 9:
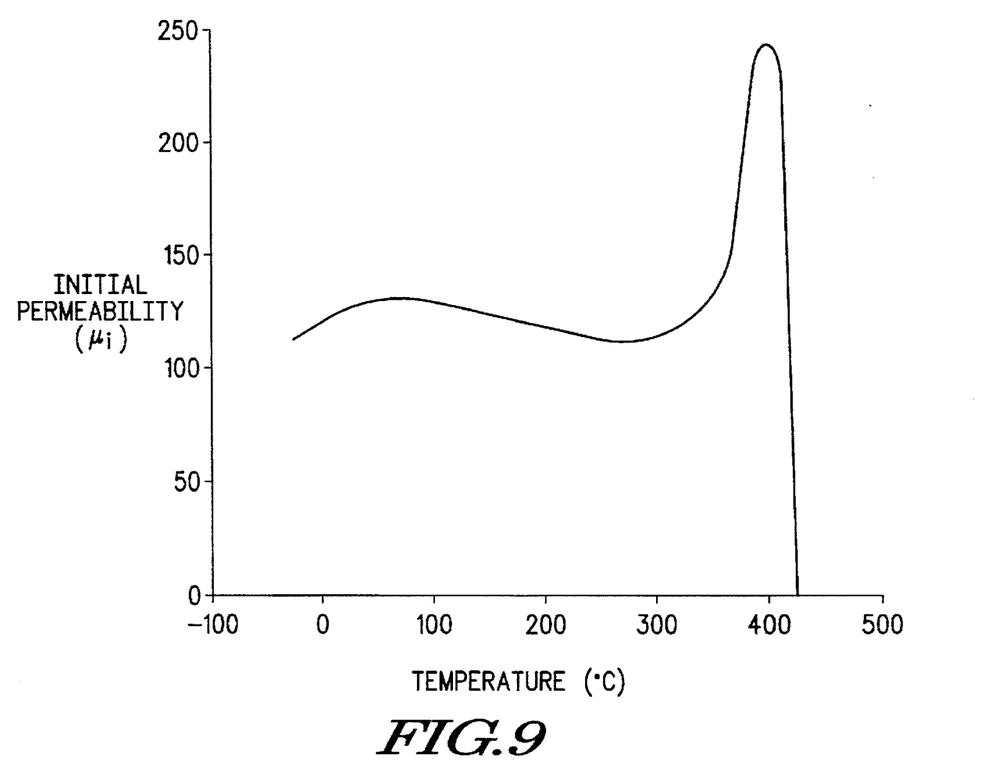
FIG. 9 graphically depicts the effect of temperature on the initial permeability of a material used in a typical soft ferrite component.

FIG. 9 is a graph demonstrating the effect of temperature on the initial permeability of a material used in a typical soft ferrite component from the nickel ferrite family. The permeability is important since it indicates the level of magnetic field intensity the material is able to carry. High permeability is desirable to permit incident field attenuation via conduction of the magnetic field lines away from the emitting or receiving circuit, but high permeability reduces lossy attenuation. While most electrical systems will operate at temperatures below 450° C., the graph of FIG. 9 is intended to demonstrate that permeability is dependent on temperature. If a material is highly permeable at a given field intensity, the loss factor (loss tangent/initial permeability) will be low. Since high permeability materials develop a level of magnetism in the presence of a magnetic field, it may be desirable for an EMI shield layer which possesses highly lossy characteristics (high loss tangent and/or high loss factor) to be present between the high permeability layer and a sensitive circuit. This will allow any magnetic field induced in the highly permeable layer to be thermally attenuated before it interacts with the sensitive circuit.

Figure 10:
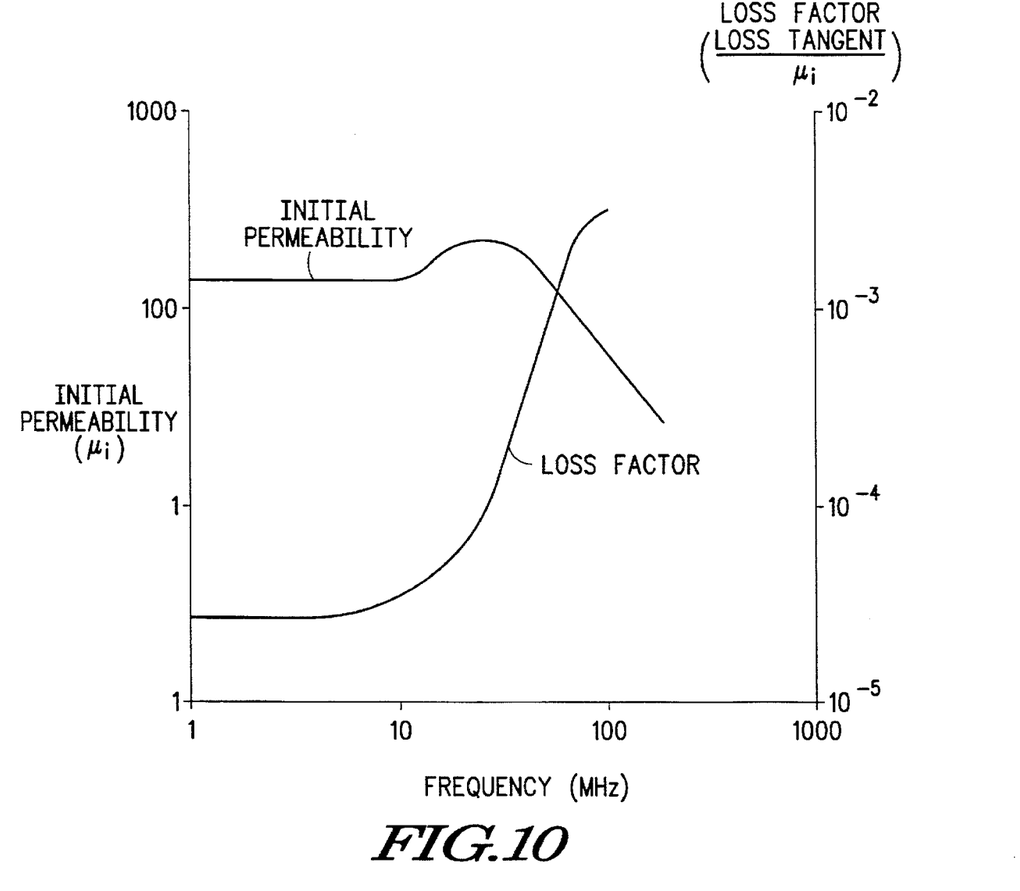
FIG. 10 is graph showing the effect of frequency on the initial permeability and loss factor of a typical soft ferrite component.

FIG. 10 graphically depicts the effect of frequency on the initial permeability and loss factor of a typical soft ferrite component. It can be seen that the loss factor rises rapidly beyond the permeability resonance point. This behavior can induce a change in the attenuation mechanism of an EMI shield layer or structure from one in which the field is conducted away (high permeability) to one in which the field is thermally dissipated, if the field frequency is increased. Generally, the higher the initial permeability, the higher the effective EMI attenuation frequency. Thus, the ferrite used to make the EMI suppression component whose characteristics are shown in FIG. 8 is useful for well over 200 MHz.

While specific shielding needs will dependent on the type of system being shielded and the system environment, following is a description of a more specific embodiment of the present invention. The description is directed to a multilayer shielding structure, such as that discussed in reference to FIG. 3. Die 13 is shielded because it is very sensitive to coupled noise from outside EMI. Coating 24 is an electrically insulative silicone gel or elastomer with no filler materials present and having a low modulus of elasticity, as indicated by Shore A durometer testing values of less than or equal to 100 for firm gels or soft elastomers, and less than or equal to 25 for soft gels. Materials possessing values outside these ranges will also be appropriate if the stresses exerted on the components does not cause reliability problems. Stresses are a function of the modulus of elasticity, the differences in thermal expansion of the system elements, and the temperature excursion time and range. In the case where a shielding layer or series of layers are coated on a PCB populated with active devices, it is undesirable for the layer directly contacting the PCB and components (such as coating 24) to be highly reflective since this would cause noise radiated from the PCB traces or active devices to be reflected back onto the source. Hence, it is desirable for the layer contacting the PCB and active devices to be highly absorptive.

On the other hand, it is desirable for the external-most shielding layer, such as layer 64, to be highly reflective. In a preferred embodiment, external shielding layer 64 is a similar silicone polymer matrix as that used for coating 24, but with the addition of filler particles specifically selected to make layer 64 highly conductive. Being very conductive, layer 64 is able to reflect incident E-field energy with high efficiency. In this case, layer 64 also contains lossy ceramic dielectric powder fillers which have high dissipation factor values of the frequencies which are to be shielded. These fillers are selected to absorb and thermally dissipate E-field energy at frequencies where device 50, or whatever device is being shielded, is particularly sensitive to noise. Layer 64 preferably also contains highly electrically conductive and ferromagnetic materials such as Ni or Fe/Ni to increase the layer's permeability and enhance the E field attenuation of layer 64.

Internal shielding layer 62 uses the same polymer matrix as the other layers, but is designed to include different filler particles to attenuate or reflect a different range of EMI frequencies than in layer 64. Fillers in layer 62 are preferably highly permeable soft ferrite materials for the conduction of magnetic field lines away from the device being shielded and for E-field attenuation due to high loss tangent possessed by the ferrites at the frequencies of the incident field. Ferromagnetic metal powders, such as Ni, Fe/Ni alloys, and Fe/Ni/Co alloys may also be added to layer 62, especially if not included in layer 64, to increase permeability and to aid in the conduction of induced currents away from die 13. Shielding layer 60 preferably contains ferrites which have high H-field attenuation characteristics. Layer 60 may also contain dielectric fillers which have a high dissipation factor to permit dissipation of the E-Field electromagnetic frequencies emitting from die 13 or input and output conductors servicing die 13.

In using a general purpose shielding layer in accordance with the present invention, the filler materials to attenuate specific frequencies or general frequency ranges may be combined together in a single polymer-base. Thus, the same attenuation and reflection properties of multilayer shielding structures can be achieved with a single coating of a general purpose shielding layer. In some instances though, the mass, thickness, or effectiveness of a single general purpose shielding layer may not be suitable in a particular application. Attenuation characteristics are a function of the shield layer thickness. Due to the variety and amount of filler particles likely in a general purpose shielding layer, the mass and thickness of the general purpose layer will be thicker than that of a more specifically targeted layer used in a multilayer application of shielding layers. Accordingly, use of a series of shielding layers may have the benefit in some applications of lower mass and thickness, but higher effectiveness in shielding. Naturally, however, additional processing is required for depositing a series of layers as opposed to one general purpose layer. Each of these factors should be considered in deciding which of the embodiments of the present invention to use.

The determination of the proper filler materials to be included in one or more shielding layers as used in the present invention may be made by conducting measurements on the electrical system and the system components. For instance, a spectrum analysis is used to determine the spectral intensity of noise emitting from the system without any of the shield coating invention applied. Alternatively, noise emission simulation may be conducted to permit a first order estimate of the actual emitted spectrum. An assessment of the spectral sensitivity of devices with low noise immunity can also be conducted. This information is used to guide the selection of dielectric, ferrite, and conductive metal powders, and the formulation of the best shield layer, or multilayer structure.

Thus it is apparent that there has been provided, in accordance with the invention, a method for shielding electronic components and a component assembly made by such a method, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to any particular number of shielding layers used. Nor is the invention limited to any particular sequence of layers (e.g. which layers attenuate which frequencies). Furthermore, between any given shielding layers there may be an insulating layer which electrically isolates the shielding layers from one another. It is also important to note that within any given shielding layer, there is likely to be filler particles of more than one material, with the exception of perhaps multilayer embodiments wherein each shielding layer is very specifically targeted by use of only one filler material. Also, the fact that one particular filler material may be used in one shielding layer, does not preclude use of the same filler material in other shielding layers for additional protection. Likewise, there may be suitable filler materials for attenuating EMI in accordance with the present invention other than those specifically mentioned. In addition, the invention does not require that separate ground planes be established for EMI ground and for power supply ground. Nor does the invention require that all shielding layers be coupled to the same ground reference. Independent references for different layers may be desirable. Moreover, the invention does not require a substrate having the structure illustrated herein. Therefore, it is intended that this invention encompass all such variations and modifications as fall within the scope of the appended claims.

I claim:

1. A shielded electronic component assembly comprising:
   a wiring substrate having a plurality of conductive signal traces and at least one ground element formed on a surface thereof;
   a semiconductor device mounted to the wiring substrate and electrically coupled to the plurality of signal traces;
   a conformal insulating layer formed over the semiconductor device and over the signal traces, such that a portion of the at least one ground element is uncovered by the insulating layer; and
   a conformal shielding layer deposited over the insulating layer and in contact with the uncovered portion of the ground element, the shielding layer comprising:
   a precursor material; and
   a first plurality of filler particles selected to attenuate electromagnetic signal frequencies within a first range of frequencies; and
   a second plurality of filler particles selected to attenuate electromagnetic signal frequencies within a second range of frequencies;
   wherein the first and second ranges of frequencies are at least partially exclusive.

2. The electronic assembly of claim 1 wherein the insulating layer comprises a compliant silicone gel.

3. The electronic assembly of claim 1 wherein the first plurality of filler particles attenuate E-field radiation and the second plurality of filler particles attenuate H-field radiation.

4. The electronic assembly of claim 3 wherein the first plurality of filler particles are selected from a group consisting: copper, copper alloys, silver, silver alloys, cobalt, cobalt alloys, titanates, niobates, and zirconates.

5. The electronic assembly of claim 3 wherein the second plurality of filler particles are selected from a group consisting of: iron, iron alloys, silver, silver alloys, nickel, nickel alloys, ferrites, and magnetic oxides.

6. The electronic assembly of claim 1 wherein the at least one ground element comprises a ground ring which surrounds the semiconductor device.

7. The electronic assembly of claim 1 wherein the semiconductor device comprises a device selected from a group consisting of: a direct chip attach semiconductor die, a encapsulated semiconductor die, and a wire-bonded semiconductor die.

8. The electronic assembly of claim 1 further comprising a plurality of semiconductor devices and wherein the insulating layer and shielding layer is formed over each of the plurality of semiconductor devices.

9. The electronic assembly of claim 1 wherein the shielding layer further comprises a third plurality of filler particles selected to attenuate electromagnetic signal frequencies within a third range of frequencies; wherein the third range of frequencies is at least partially exclusive from the first and second ranges of frequencies.

10. The electronic assembly of claim 1 wherein the at least one ground element comprises a first ground element and a second ground element electrically isolated from the first, and wherein the first ground element is electrically connected to the semiconductor device and the second ground element is electrically connected to the conformal shielding layer.

11. A shielded electronic component assembly comprising:
   a wiring substrate having a plurality of signal members and a ground member;
   a semiconductor device mounted on the substrate and electrically coupled to the plurality of signal members;
   an insulative conformal coating formed over the semiconductor device and the plurality of signal members;
   a first conformal shielding layer formed over the insulating layer and electrically coupled to a first portion of the ground member, wherein the first conformal shielding layer comprises a polymer precursor material filled with particles selected to attenuate a first range of electromagnetic signal frequencies; and
   a second conformal shielding layer formed over the first conformal shielding layer and electrically coupled to the ground member, wherein the second conformal shielding layer comprises a polymer precursor material filled with particles selected to attenuate a second range of electromagnetic signal frequencies, wherein the first and second ranges of frequencies are at least partially exclusive.

12. The electronic assembly of claim 11 wherein the semiconductor device comprises a device selected from a group consisting of: an exposed semiconductor die and a packaged semiconductor die.

13. The electronic assembly of claim 11 further comprising a third conformal shielding layer formed over the second conformal shielding layer and electrically coupled to the ground member.

14. The electronic assembly of claim 11 wherein the first range of electromagnetic frequencies comprise predominately H-field frequencies and the second range of electromagnetic frequencies comprise predominately E-field frequencies.

15. The electronic assembly of claim 11 wherein the ground member comprises a ground ring which surrounds the semiconductor device.

16. The electronic assembly of claim 11 wherein the ground member comprises a first ground member and a second ground member electrically isolated from the first, and wherein the first ground member is electrically connected to the semiconductor device and the second ground member is electrically connected to the first conformal shielding layer.

17. The electronic assembly of claim 11 wherein the second conformal shielding layer is electrically coupled to the ground member through the first shielding layer.

18. The electronic assembly of claim 11 wherein the second conformal shielding layer is electrically coupled to the ground member by a direct connection between the second shielding layer and the ground member.

19. The electronic assembly of claim 11 wherein the ground member is a first ground member, and further comprising a second ground member electrically independent from the first ground member, and wherein the first shielding layer is electrically connected to the first ground member and the second shielding layer is electrically connected to the second ground member.

20. A shielded electronic component assembly comprising:
    a semiconductor device to be shielded from a range of electromagnetic frequencies;
    a reference potential source;
    a housing enclosing the semiconductor device within the assembly, the housing having a plurality of interior surfaces;
    a conformal shielding layer formed on all interior surfaces of the housing and electrically connected to the reference potential source, the conformal shielding layer comprising:
        a first polymer precursor material; and
        a first plurality of filler particles of a first material within the precursor material which attenuate a first portion of the range of the electromagnetic frequencies; and
        a second plurality of filler particles of a second material within the precursor material which attenuate a second portion of the range of electromagnetic frequencies.

21. The electronic assembly of claim 20 wherein the second portion of the range of frequencies is at least partially exclusive of the first portion of the range.

22. The electronic assembly of claim 20 wherein the first plurality of filler particles attenuate E-field radiation and the second plurality of filler particles attenuate H-field radiation.

23. The electronic assembly of claim 20 wherein the shielding layer is a first conformal shielding layer, and further comprising a second conformal shielding layer formed on the first conformal shielding layer, wherein the second shielding layer comprises:
    a second precursor material;
    a third plurality of filler particles of a third material within the second precursor material which attenuates a third portion of the range of electromagnetic frequencies which is at least partially exclusive of the first and second portions.

24. A method for shielding an electronic component from a range of electromagnetic frequencies comprising the steps of:
    providing a wiring substrate having a plurality of signal traces and at least one ground element formed on a surface thereof;
    providing an electronic component;
    mounting the electronic component to the wiring substrate such that the component is electrically coupled to the plurality of signal traces;
    depositing an insulative coating over the electronic component and the plurality of signal traces;
    providing a first shielding material, wherein the first shielding material comprises:
        a first precursor material; and
        a first plurality of filler particles selected to attenuate at least a first portion of the range of electromagnetic frequencies; and
    depositing the first shielding material on the insulative coating and over the electronic component such that the shielding layer is in electrical contact with the at least one ground element.

25. The method of claim 24 wherein the step of providing a first shielding material comprises providing a first shielding material further comprising a second plurality of filler particles of a different material than the first plurality of filler particles, wherein the second plurality of filler particles is selected to attenuate at least a second portion of the range of electromagnetic frequencies, and wherein the second portion of the range of electromagnetic frequencies is at least partially exclusive of the first portion.

26. The method of claim 24 further comprising the steps of:
    providing a second shielding material, wherein the second shielding material comprises:
        a second precursor material; and
        a second plurality of filler particles selected to attenuate at least a second portion of the range of electromagnetic frequencies; and
    depositing the second shielding material over the first shielding layer.

27. The method of claim 26 wherein the step of providing a second shielding material comprises providing a second shielding material wherein the second plurality of filler particles attenuate a second portion of the range of electromagnetic frequencies which is at least partially exclusive of the first portion.

* * * * *